(12) United States Patent
Makinwa et al.

(10) Patent No.: US 8,665,130 B2
(45) Date of Patent: Mar. 4, 2014

(54) ADC, A TEMPERATURE SENSOR, A NON-CONTACT TRANSPONDER, AND A METHOD OF CONVERTING ANALOG SIGNALS TO DIGITAL SIGNALS

(75) Inventors: Kofi Afolabi Anthony Makinwa, Delft (NL); Kamran Souri, Rijswijk (NL)

(73) Assignee: NXP, B.V., Eindhoven (NL)

( * ) Notice: Subject to any disclaimer, the term of this patent is extended or adjusted under 35 U.S.C. 154(b) by 294 days.

(21) Appl. No.: 13/021,235

(22) Filed: Feb. 4, 2011

(65) Prior Publication Data
US 2011/0200070 A1 Aug. 18, 2011

(30) Foreign Application Priority Data
Feb. 4, 2010 (EP) .................................... 10152706

(51) Int. Cl.
*H03M 1/12* (2006.01)
(52) U.S. Cl.
USPC .......................................... 341/156; 341/155
(58) Field of Classification Search
USPC .................. 341/156, 155, 143, 172, 163, 120
See application file for complete search history.

(56) References Cited

U.S. PATENT DOCUMENTS

| | | | |
|---|---|---|---|
| 5,305,004 A * | 4/1994 | Fattaruso | 341/120 |
| 7,446,598 B2 | 11/2008 | Pertijs et al. | |
| 7,495,589 B1 | 2/2009 | Trifonov et al. | |
| 7,504,977 B2 | 3/2009 | Doorenbos et al. | |
| 7,944,386 B2 * | 5/2011 | Hurrell et al. | 341/155 |
| 2007/0018714 A1 * | 1/2007 | Willis | 327/512 |
| 2008/0094131 A1 | 4/2008 | Pertijs et al. | |
| 2008/0258951 A1 | 10/2008 | Doorenbos et al. | |

FOREIGN PATENT DOCUMENTS

| | | |
|---|---|---|
| WO | 9613903 A1 | 5/1996 |
| WO | 0032095 A1 | 6/2000 |
| WO | 2007112189 A1 | 10/2007 |

OTHER PUBLICATIONS

Ranjbar, M, et al. "A Low-Power 1.92MHz CT ΔΣ Modulator With 5-bit Successive Approximation Quantizer," IEEE Custom Integrated Circuits Conf., pp. 5-8 (Sep. 13, 2009).
Ping, L. "A Combined Successive and Σ-Δ A/D Conversion Scheme," Proc. of the International Symp. on Circuits and Systems, Chicago, pp. 1294-1297 (May 1993).
Texas Instruments, datasheet TMP102, "Low Power Digital Temperature Sensor With SMBus™/Two-Wire Serial Interface in SOT563," (Oct. 2008).
Extended European Search Report for European Patent Appin. No. 10152706.7 (May 7, 2010).

(Continued)

*Primary Examiner* — Joseph Lauture (57) ABSTRACT

An ADC is disclosed which has, as a first stage, a successive approximation converter, or other compensated, direct comparison converter, followed by a sigma delta modulation converter as a second stage. The sigma delta converter may beneficially be a first order modulator. The resulting ADC combines accuracy with low power consumption per conversion, and thus is particularly suited for use in temperature sensors for applications such as RFID transponders. Such a temperature sensor and an RFID transponder are also disclosed. There is also disclosed a method of analog-to-digital conversion, comprising a first successive approximation register or other compensated, direct comparison conversion stage followed by a sigma delta modulation stage, which, further, may be combined with providing a proportional-to-absolute-temperature (PTAT) signal, for low-power, accurate temperature sensing.

14 Claims, 5 Drawing Sheets

(56) References Cited

OTHER PUBLICATIONS

A.L. Aita, M.A.P. Pertijs, K.A.A. Makinwa and J.H. Huijsing, "A CMOS Smart Temperature Sensor with a Batch-Calibrated Inaccuracy of ±0.25° C (3δ) from -70 to 130° C," Digest ISSCC, pp. 342-343, Feb. 2009.

M.A.P. Pertijs, K.A.A. Makinwa, J.H. Huijsing, "A CMOS temperature sensor with a 3s inaccuracy of ±0.1° C from -55° C to 125° C," J. Solid-State Circuits, vol. 40, is. 12, pp. 2805-2815, Dec. 2005.

* cited by examiner

*Figure 1*

Prior Art

ADC, A TEMPERATURE SENSOR, A NON-CONTACT TRANSPONDER, AND A METHOD OF CONVERTING ANALOG SIGNALS TO DIGITAL SIGNALS

CROSS-REFERENCE TO RELATED APPLICATION

This application claims the priority under 35 U.S.C. §119 of European patent application no. 10152706.7, filed on Feb. 4, 2010, the contents of which are incorporated by reference herein.

FIELD OF THE INVENTION

This invention relates to analog-to-digital converters. It further relates to a method of converting analog signals to digital signals. It also relates to temperature sensors including an analog-to-digital conversion stage, and non-contact transponders incorporating such temperature sensors.

BACKGROUND OF THE INVENTION

Analog-to-digital converters (ADCs) are used in a wide range of applications. The operational requirements of an ADC depend on the application, and typically include a minimum speed of response and a minimum resolution. Furthermore, the power consumption of the device can for some applications be important.

Figure 1:
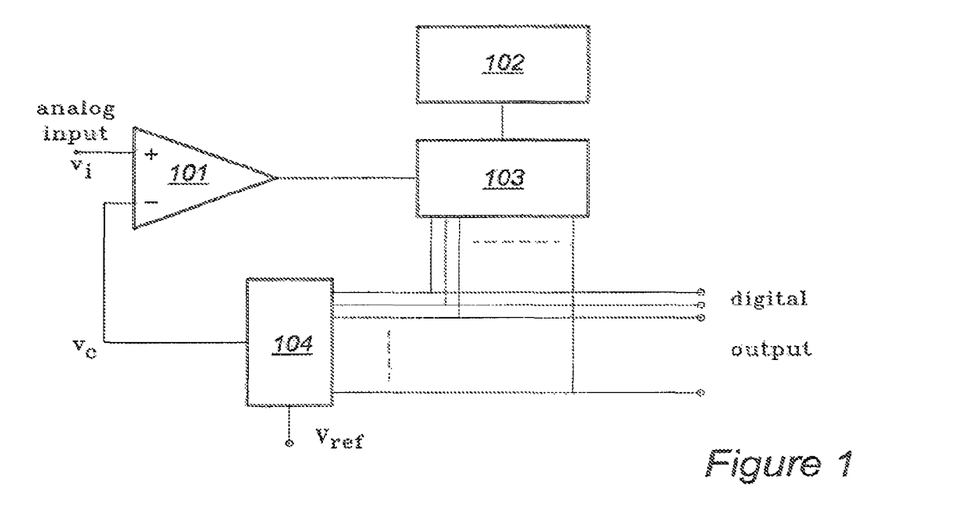
FIG. 1 is a schematic diagram of a SAR ADC.
Figure 2:
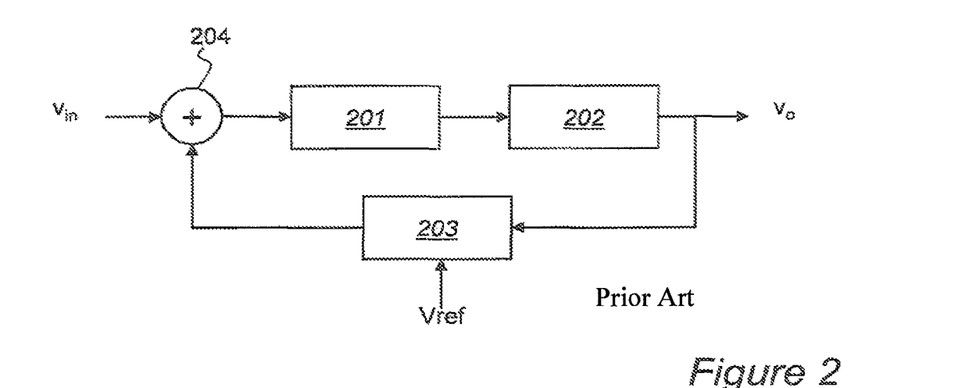
FIG. 2 is a schematic diagram of a sigma delta ADC.

Two commonly used types of ADC are the successive approximation register (SAR) ADC, and the sigma delta (ΣΔ) ADC. A typical SAR ADC comprises a comparator 101 and a shift register and SAR logic 103, which is clocked by means of clock generator 102, as shown in FIG. 1. The shift register provides the ADC results. In operation, the voltage input $v_i$ is compared with reference voltages $v_c$: if the input voltage is higher than the reference level or reference voltage (which is set to one half of an initial reference voltage Vref), a logical "1" is shifted into the shift register; conversely, if the input voltage is less than the reference level, a logical "0" is shifted into the shift register. Next, the reference level $v_c$ is either increased or decreased by one quarter the original reference voltage, depending on the whether the comparison output produced a "1" or a "0". In the next iteration, the input voltage is compared with the reference level (which is now either three-quarters or one quarter of the initial reference voltage), and again a "1" or a "0" shifted into the shift register in dependence on the comparison result. In successive stages, the reference level is shifted up or down by a successively smaller amounts (⅛ the initial voltage, 1/16 the initial voltage and so on), a further bit being added to the shift register at each stage. In order to increase the resolution of the SAR ADC, a single further iteration is required A typical sigma delta ADC, also hereinafter referred to as a delta-sigma ADC, is based on sigma-delta modulation (SDM), as illustrated in FIG. 2. FIG. 2 shows a conventional sigma-delta modulator comprising a loop filter 201, a quantizer 202 and a feedback path including a digital-to-analog converter DAC 203, which performs digital to analog conversion based on a reference signal Vref. The output of the DAC 203 is subtracted from the input signal at a summing node 204. Sigma-delta modulators act as a low-pass filter to the input signal and a high pass filter to quantization noise. The output of the quantizer is further processed in a digital decimation filter. A sigma-delta ADC therefore consists of the combination of a sigma-delta modulator and a decimation filter.

In a first order sigma-delta converter, in order to add a single bit to the resolution, it is necessary to double the number of steps or iterations.

Higher order SDMs, with more integrators in the forward path, are known, in which the resolution increases more than linearly—although not as rapidly as a in a typical SAR; however these are generally more complex, and may have lower stability. The skilled person will appreciate that, with regard to resolution, the effective number of bits (ENOB) is related to the number of conversion steps N as follows:

1st order: $ENOB=\log_2(N)$,
2nd order: $ENOB<2*\log_2(N)$

Or in other words, for the same number of cycles, a 2nd order modulator has almost twice the resolution (in bits) as a 1st order modulator, albeit with higher complexity (and typically higher power requirements).

United States patent application publication number US 2008/0258 951, also published as U.S. Pat. No. 7,504,977, discloses a hybrid delta-sigma/SAR analog-to-digital converter and methods for using such, wherein a delta sigma ADC is used to provide a first portion of the conversion result, and finer resolution—that is to say, a second portion of the result—is provided by an SAR ADC. Since the conversion time required to provide successively finer resolution using a delta-sigma ADC increases exponentially with the number of bits, the sigma delta ADC is used only for the most significant bits, and an SAR is used for the remaining, or less significant, bits, which speeds up the operation. However, the accuracy of this hybrid ADC is limited by the matching of the capacitors (or other elements) used to define the comparison levels of the successive approximation step.

A low-power digital temperature sensor comprising a sigma delta ADC converter is disclosed in the datasheet TMP102 of Texas Instruments.

There remains an ongoing need for a low-power, accurate ADC, and for such an ADC which is compatible with temperature sensing in non-contact transponders.

SUMMARY OF THE INVENTION

According to a first aspect of the invention, there is provided an analog-to-digital converter (ADC), for a non-contact transponder and comprising an analog input, a direct comparison converter, a sigma-delta converter and a digital output, characterised in that the direct comparison converter is configured to determine a first approximation to the digital output, and the sigma delta converter is configured to determine the digital output from the first approximation. Beneficially, the first step may be fast although relatively inaccurate; the second step may then be required to cover only a small range of voltages around the approximate value, allowing for use of a sigma delta converter, without an undue burden of time (and thus energy). ADCs according to embodiments of the invention may combine the speed of successive approximation with the accuracy of sigma delta modulation.

In embodiments, the direct comparison converter comprises a successive approximation register converter. Alternatively, but without limitation, other algorithms, for example a single slope algorithm or a SAR with over-range, such as will be immediately apparent to the person skilled in the art, may be employed. Further, the direct comparison converter may be a flash ADC, as another non-limiting alternative to a SAR ADC, or a single slope ADC which may also be termed a ramp-type ADC.

In preferred embodiments, the sigma delta converter is based on a first order sigma delta modulator, since such converters are simpler and less power hungry than alternative converters such as second, or higher, order sigma delta modulators, which are nonetheless within the scope of the invention. Such second, or higher, order converters generally have two or more integrators in the loop. In other embodiments, higher order sigma-delta modulators may be used instead of a first order type. Higher order converters offer even faster conversion time and may provide in some cases for less over-all energy consumption.

In embodiments, the digital output has at least 10-bit resolution, and may have at least 15-bit resolution. Such embodiments provide precise digital outputs, using only limited power or a small amount of energy per conversion. In embodiments, the first approximation has a resolution of at least 4 bits.

In embodiments, the compensating direct comparison converter comprises digital logic, an integrator and a comparator. The integrator and the comparator each comprise a part of the sigma delta converter. Such embodiments prove to be particularly compact and space efficient designs.

In embodiments, the sigma delta converter is configured to operate with at least one guard-band capacitor. In other embodiments, the sigma-delta converter is configured to operate without a guard-band capacitor. In cases in which errors in reference voltages during the first conversion stage are sufficiently small, use of guard-band capacitors and a guard-band step may not be necessary.

In embodiments, the sigma delta converter is configured to use at least one of dynamic error correction and dynamic element matching. Dynamic error correction techniques such as chopping, correlated data-sampling and auto-zeroing may be effective in reducing any offset of the integrator, and dynamic element matching may be effective to increase the accuracy of voltage references $V_{RefN}$ and $V_{RefP}$, as will be further explained herebelow.

According to another aspect of the invention, there is provided a temperature sensor comprising an analog-to-digital converter as described above and further comprising a bipolar core, which bipolar core comprises two transistors each having a bias-emitter voltage and configured such that in operation the difference between the respective bias-emitter voltages is proportional to absolute temperature.

According to a further aspect of the invention, there is provided a non-contact transponder comprising such a temperature sensor and a power circuit for providing power to the temperature sensor. In embodiments the power circuit is configured to, in use, extract power from an electro-magnetic field. The electromagnetic field may be provided by, for instance, an RFID card reader during the process of interrogating the non-contact transponder.

According to a yet further aspect of the present invention, there is provided a method of converting an analog signal to a digital signal comprising a successive approximation register stage followed by a sigma delta converter stage. In embodiments, the sigma delta converter stage is first order.

In embodiments the successive approximation stage is carried out by means of a successive approximation register comprising an integrator and a comparator, the sigma delta stage is carried out by means of a sigma delta converter, and prior to the sigma delta stage the integrator and the comparator are reconfigured to comprise a part of the sigma delta converter.

In embodiments, the method comprises part of a method of sensing temperature, which also comprising determining a analog input which is proportional to absolute temperature.

These and other aspects of the invention will be apparent from, and elucidated with reference to, the embodiments described hereinafter.

BRIEF DESCRIPTION OF THE DRAWINGS

Embodiments of the invention will be described, by way of example only, with reference to the drawings, in which

FIG. 4 is a schematic showing, at FIG. 4a a coarse conversion stage, and at FIG. 4b a fine conversion stage, of an analog-to-digital converter according to embodiments of the invention;

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments

DETAILED DESCRIPTION OF EMBODIMENTS

Figure 3:
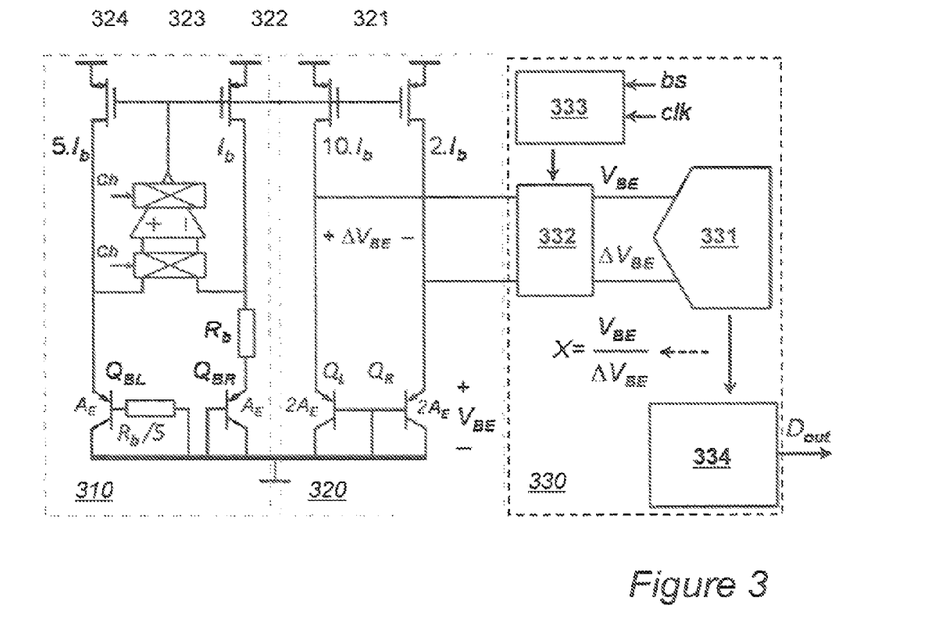
FIG. 3 is a block diagram of a temperature sensor according to embodiments of the invention.

A temperature sensor according to one aspect of the present invention is shown in schematic form in FIG. 3. It comprises three main parts: a bias circuit 310, a bipolar core 320 and a zoom ADC 330. The bias circuit comprises a pair of biasing transistors $Q_{BL}$ and $Q_{BR}$ having grounded collectors, the base of one of which ($Q_{BL}$) is connected to ground by a first biasing resistor (Rb/5), the base of the other ($Q_{BR}$), being directly grounded. The emitters of the transistors are connected to a supply voltage respectively via MOSFETs 323 and 324, in the case of $Q_{BR}$ by a second biasing resistor Rb. The emitters are linked by an operational amplifier which forces the voltages on the drains of MOSFETs 323 and 324 to be the same, which in turn forces the voltage across the resistor Rb to be a function of the difference in the base-emitter voltages of $Q_{BL}$ and $Q_{BR}$. This action establishes a well-defined bias current of Ib through the resistor. The MOSFETs are sized such that the ratio of their drain currents is 5, resulting in bias currents of 5.Ib and Ib in the left and right arms respectively. The resistor Rb/5 implements a beta cancellation scheme, as will be known to the skilled person, and as described in, for instance, U.S. Pat. No. 7,446,598, the whole content of which are hereby incorporated by reference. MOSFETs 323 and 324 form part of doubling current mirrors, along with respective MOSFETs 322 and 321, in order to provide respective bias currents of 10.Ib and 2.bB to the bipolar core.

In the bipolar core 320 two substrate PNP transistors $Q_L$ and $Q_R$ having a common base connection, are biased at a 1:5 current ratio, by means of the MOSFETs 322 and 321. As will be immediately apparent to the skilled person, the term "substrate transistor" as used herein is a transistor in which the collector current flows into the substrate, rather than into a discrete collector terminal. The respective base emitter output voltages ($V_{BE1}$ and $V_{BE2}$) are output to the zoom ADC 331 which forms part of ADC stage 330, along with the difference between them, $\Delta V_{BE}$, by means of multiplexer 332. Multiplexer 332 is under the control of controller logic unit 333. The base emitter voltage difference $\Delta V_{BE}$ is approximately proportional to absolute temperature (PTAT) having a positive temperature coefficient of about 140 μV/K; the base emitter voltages are complementary to absolute temperature (CTAT), and have a negative temperature coefficient of about 2000 μV/K The digital output from the zoom ADC 331 is supplied via digital backend 334, as $D_{out}$.

The zoom ADC digitizes a ratio $X=V_{BE}/\Delta V_{BE}$. Although X is a nonlinear function of temperature, a more linear function of temperature, μ, can be calculated as:

$$\mu = \alpha/(\alpha+X) = \alpha\Delta V_{BE}/(V_{BE}+\alpha\Delta V_{BE})$$

where α is a programmable gain factor that can be adjusted for optimal linearity. In this optimal case, the denominator will be nearly constant. In this embodiment, the value of α is also trimmed to compensate for the PTAT spread of $V_{BE}$. This is done in the digital backend and is much simpler to realise than alternative analog techniques such as trimming the bias current applied to $Q_L$ and $Q_R$.

The value X can be expressed in the form:

$$X = n + \mu',$$

where n is an integer, and μ' is a fractional part, and each can be separately determined by a zoom ADC as will be described below.

To minimize the sensor's energy consumption, a fast, lower-power ADC is required, since the bias circuit and bipolar core continuously draw current throughout a conversion. It is known to use sigma delta converters for temperature sensors, with 1st-order ADCs offering low complexity, while 2nd-order ADCs achieve faster speed at the expense of greater complexity and somewhat greater power dissipation.

A zoom ADC 331 according to an embodiment of another aspect of the present invention is shown in FIG. 4. According to embodiments of this aspect of the invention the digitization of the analog signal is done in two steps. In a first step a relatively inaccurate, but fast, algorithm, such as a successive approximation algorithm, can be used to identify the approximate value of the analog signal. In the second set, a sigma delta modulator is used to accurately determine the digital result. However, the dynamic range of the sigma delta modulator is now arranged to cover only a small range of voltages around the approximate value determined during the first step; as a result, a simple first-order sigma delta modulator can be used, instead of the more complex and power hungry second-order modulator such as is used, alone, in the prior art. Since the bitstream output of a sigma delta modulator is typically averaged in a digital decimation filter, dynamic error correction techniques such as chopping and dynamic element matching (DEM), the implementation of which will be immediately apparent to the skilled person, can be used to obtain high accuracy after such filtering, even with relatively low accuracy components.

Figure 4A:
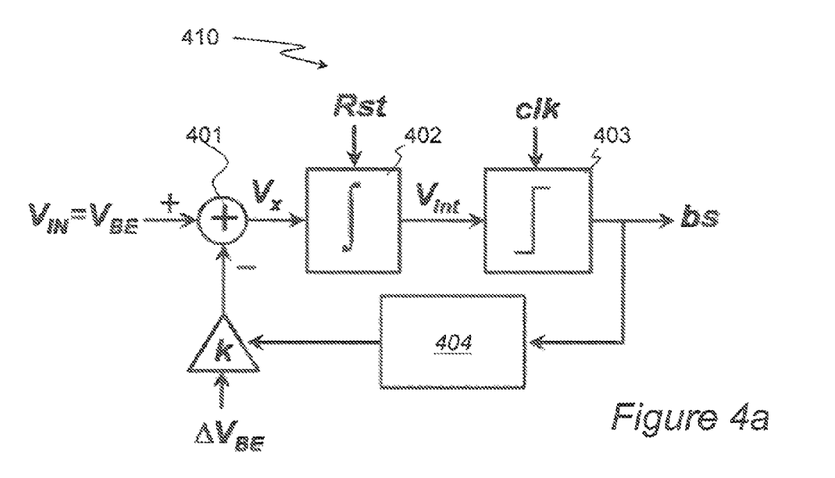

FIG. 4a shows a block diagram of an ADC configured as a SAR converter 410 for use in the first step of the digitization. The input voltage Vin is equal to $V_{BE}$ and from this is subtracted, at adder 401, the value of $\Delta V_{BE}$, that is to say, a value $k \cdot \Delta V_{BE}$, with k=1. The resulting voltage Vx is integrated in integrator 402, which has been reset at the start of the cycle by means of reset signal Rst, to provide an integrated voltage Vint. The polarity of Vint is checked in comparator 403, which comparator 403 is clocked by clock signal clk. If Vint is negative, it implies that $V_{BE} < k \cdot \Delta V_{BE}$, and a logical "0" is output on the binary output pin bs.; conversely, if Vint is positive, a logical "1" is output on the binary output signal bs. Depending on the result, the value of k can then be adjusted by controller logic 404, the integrator again reset and another comparison can be made. By proper implementation of the logic, the circuit can be made to implement the successive approximation algorithm. Note that instead of implementing this algorithm, the value of k can be incremented in successive steps from some minimum value $k_{min}$ to some maximum value $k_{max}$, until the output of the comparator changes polarity. This will simplify the logic, at the expense of increasing the conversion time. Alternatively, knowledge of the previous input voltage can be used to limit the search range of the converter and thus speed up the conversion.

Using the ADC configured in this manner, it is thus possible to determine the integer part of X, that is to say, n.

Figure 4B:
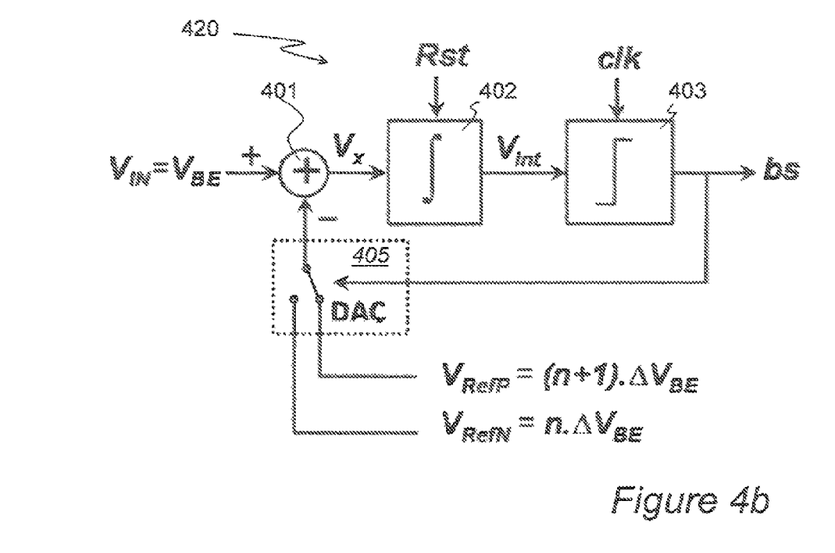

FIG. 4b shows a block diagram of the ADC reconfigured as a sigma-delta converter 420 for use in the second step, or stage, of the digitization, once the integer part n of X has been determined as above. The ADC reuses the same integrator 402, comparator 403 and adder 401. However, in this case, the ADC is configured to be a charge-balancing sigma-delta ADC, with a digital-to-analog converter (DAC) 405 in the feedback loop, together with positive and negative references $V_{RefP}$ and $V_{RefN}$, where $$V_{RefP} = (n+1) \cdot \Delta V_{BE}, \text{ and}$$

$$V_{RefN} = n \cdot \Delta V_{BE}.$$

The reference values $V_{RefP}$ and $V_{RefN}$ are fed back so as to drive Vint towards zero. So if the comparator output is a logical 1, $V_{RefN}$ is fed back and if it is a logical 0, $V_{RefP}$ is fed back. The average of the comparator's bitstream average then represents a weighted average of $V_{RefP}$ and $V_{RefN}$, that is to say, a number that is somewhere between these two values.

Figure 5:
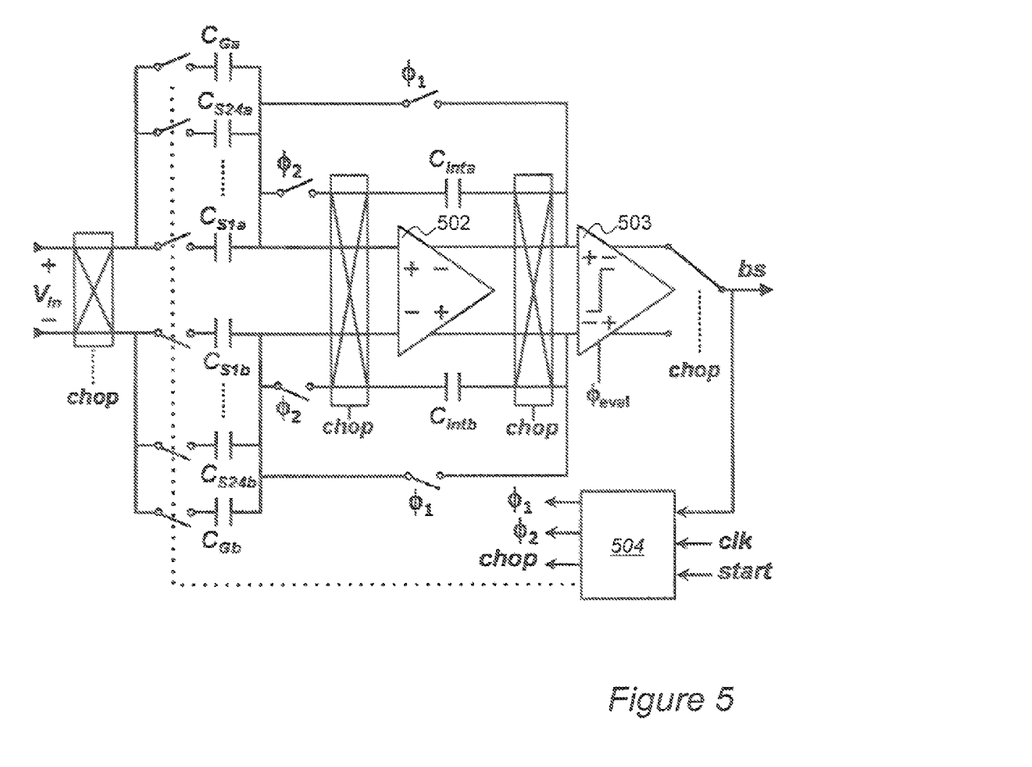
FIG. 5 shows a schematic circuit diagram of an ADC according to embodiments of the invention.

FIG. 5 shows the circuit diagram of a zoom ADC according to embodiments of the invention. The zoom ADC comprises a modified first order switched capacitor (SC) sigma delta (ΣΔ) ADC with 24 (or 48 In the case of the full differential circuit) unit sampling capacitors ($C_{S1a} \ldots C_{S24a}, C_{S1b} \ldots C_{S24b}$). At the start of each comparison step during the coarse conversion, the integrator 502 is reset. $V_{BE}$ is then sampled on a unit capacitor and integrated. In the next cycle, $-\Delta V_{BE}$ is sampled on k unit capacitors and also integrated. The binary output bs of comparator 503 then indicates the result of the comparison $V_{BE} > k \Delta V_{BE}$. That is to say, it indicates the polarity of $[V_{BE} - k\Delta V_{BE}]$. Control logic 504 implements the SAR algorithm, with which n typically can be determined within a small number of comparison steps comparison steps (5 in the particular embodiment adapted for the temperature sensor described below). Once n is known, the fine conversion step is carried out with the delta-sigma charge-balancing scheme, as discussed above with respect to FIG. 4b: after an initial reset, the modulator operates as follows: when bs=0, ($V_{BE} - n\Delta V_{BE}$) is integrated, and when bs=1, ($V_{BE} - (n+1) \cdot \Delta V_{BE}$) is integrated. Since the net integrated charge is zero, $$\mu' \cdot (V_{BE} - (n+1) \cdot \Delta V_{BE}) + (1-\mu') \cdot (V_{BE} - n\Delta V_{BE}) = 0$$

and so the bitstream average, which by definition will vary between 0 and 1, is the desired $\mu' = (V_{BE} - n \Delta V_{BE})/\Delta V_{BE}$.

To ensure that quantisation errors during the coarse conversion do not lead to out-of-range errors during the fine conversion, in embodiments the range of the fine conversion is set to 2 $\Delta V_{BE}$ rather than to $\Delta V_{BE}$. This may be done such that the unknown $\Delta V_{BE}$ is always roughly in the middle of this range, thereby relaxing the requirements on the course conversion. By comparing $V_{BE}$ to $(n+0.5) \Delta V_{BE}$, during an extra guard-band cycle, implemented by the extra sampling capacitors $C_{Ga}$ and $C_{Gb}$ each with a value of approximately half the unit sampling capacitors, the fine conversion can be appropriately set up to cover either the range $(n-1)\cdot\Delta V_{BE}$ to $(n+1)\cdot\Delta V_{BE}$ or the range $n\cdot\Delta V_{BE}$ to $(n+2)\cdot\Delta V_{BE}$ As shown in FIG. 5, the main element of the zoom ADC 331 is a SC integrator built around a folded-cascoded operational amplifier 502 with a gain of about 90 dB. Due to the relaxed requirements on the ADC's resolution, no gain boosting is required, thus reducing area and power. The sampling capacitors are also quite small: in the specific embodiment shown, $C_S$=120 fF. The guard-band cycle is implemented by guard-band capacitor $C_G \approx 0.5 C_S$. The opamp's offset and 1/f noise are reduced by correlated double-sampling (CDS) during the coarse and fine conversions; furthermore, the entire ADC is chopped once per fine conversion, as will familiar to the skilled person. Each comparison step requires two clock cycles, starting with a $V_{BE}$ integration and followed by a $-k\cdot\Delta VBE$ integration. As in known ADCs, a charge proportional to $V_{BE}$ is integrated during one clock cycle, while a charge proportional to $k\cdot\Delta V_{BE}$ is integrated during the other. In the coarse conversion, k is determined by the state of the SAR algorithm, while in the fine step, k is either equal to n (bs=0) or n+1 (bs=1).

The embodiments above have been described, with reference to a successive approximation register configuration for the first stage of the conversion. However, the skilled person will appreciate that the invention is not limited thereto; other compensating ADC configurations, in which the output of a DAC is directly compared to the unknown input may be employed. Examples of other such compensating direct comparison ADCs included ADCs in which different algorithms (other than SAR) are used to find the closest DAC value. For example, without limitation, a single slope algorithm could be used, or a SAR algorithm with over-range, in which the comparison ranges may overlap. Thus the invention covers other direct comparison ADCs in addition to SARs, and in particular covers, but is not limited to, flash ADCs and single-slope or ramp-type ADCs.

According to an embodiment of another aspect of the invention, the zoom ADC is integrated in a temperature sensor. A prototype such sensor has been realized in a standard 0.16 µm CMOS process. It dissipates 10.8 µW from a 1.8V supply. For flexibility, the digital back-end, the control logic and the sigma-delta modulator's digital decimation filter are implemented off-chip.

Figure 6:
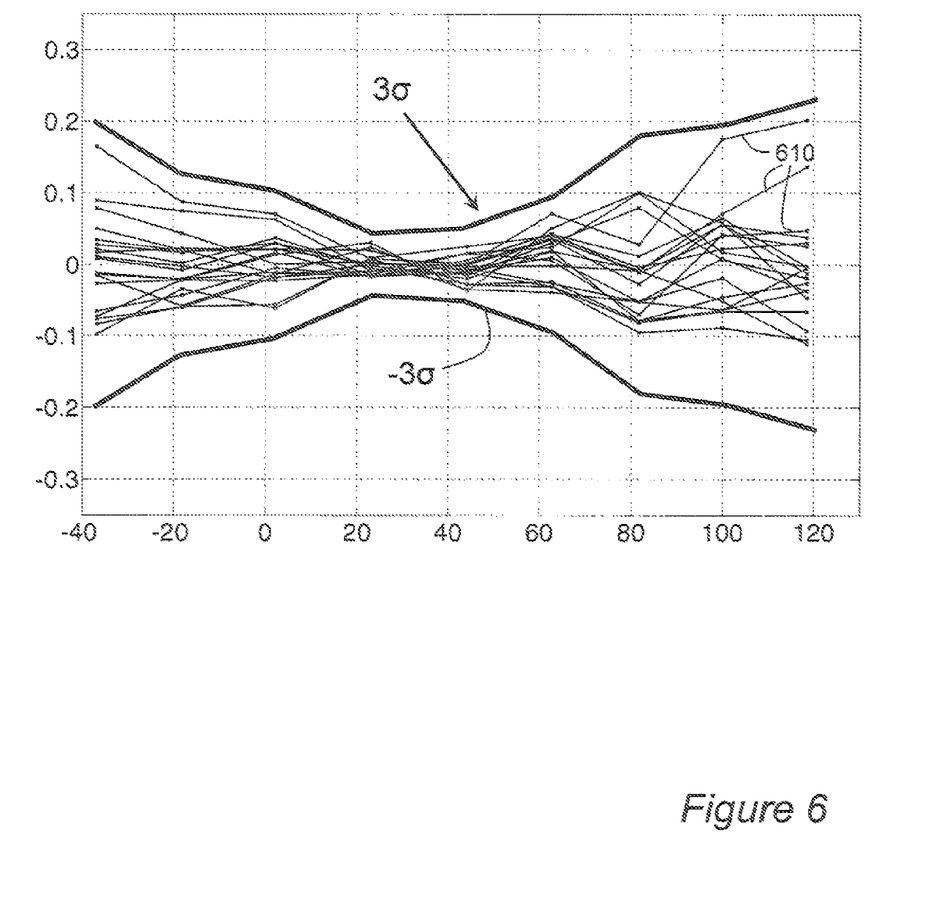
FIG. 6 shows a graph of measurement error against measured temperature for a temperature sensor according to embodiments of the invention.

FIG. 6 shows the measured temperature error 610, in ° C., on the y-axis, against the temperature in ° C. plotted on the x-axis, for a batch of 19 devices in ceramic DIL packages. They were measured over the temperature range from −40° C. to 125° C. The batch-calibrated inaccuracy was ±0.5° C. (3σ, 12 devices), after digital compensation for residual curvature; this improved to ±0.25° C. (3σ, 19 devices) as shown in the figure, after trimming the value of α, that is to say, α-trimming, at 30° C. At 10 conversions/sec (1000 cycles), the sensor achieves a kT/C limited resolution of 18 mK (rms), while dissipating 7× less power than a conventional sensor with similar accuracy.

Temperature sensors according to embodiments of the invention are, without limitation, particularly suited for use in a non-contact transponder. Such non-contact transponders, also known as RFID tags, labels or chips, commonly have limitations on power consumption. In order to reduce their cost and size, RFID tags typically do not have their own power supply, but rely on scavenging power from an electromagnetic field, produced by an RFID card reader which is being used to interrogate the tag. The power scavenged may be of the order of microwatts, and since typically the tag is limited to a small volume, and the interrogation only lasts a limited period, it is rarely possible to store a significant amount of energy in the tag. All the operations required by the tag—in this case, the temperature sensing operations including ADC—must thus conform to a stringent power budget.

The skilled person will appreciate that the invention is not limited to temperature sensing, but is particularly suited, in addition and without limitation, to sensing of other, slowly-varying signals. The invention is particularly well-suited to signals which do not change significantly, that is to say, by more than one least significant bit (LSB), between the two stages.

Figure 7:
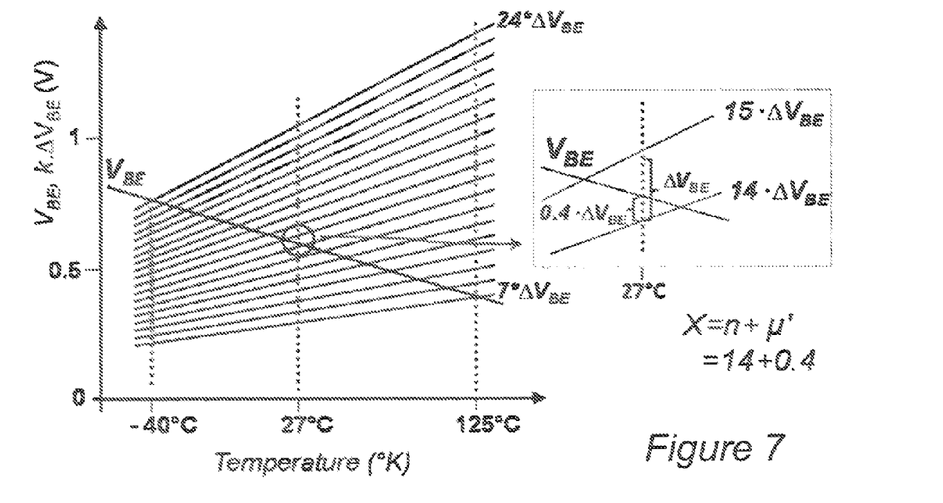
FIG. 7 is a graph showing of the base-emitter voltage and the differences between base emitter voltage over a temperature range, for the sensing transistors in a temperature sensor according to embodiments of the invention.

As the skilled person will appreciate, the invention is based, in part, on the insight that the quantity X, defined above as $V_{BE}/\Delta V_{BE}$, is a useful intermediate parameter, and a good starting point for low-power and accurate digitization. For a greater understanding of this the reader is referred to FIG. 7 which, on the left hand side, shows a graph of $V_{BE}$, and $k\cdot\Delta V_{BE}$ for integer k between 7 and 24, plotted against temperature over a range from −40° C. to 125° C. It should be noted that the non-linearity of this relationship between X and temperature holds in general and is not specific to the embodiment described above, although the actual relationship will depend on the current ratio used, which determines $\Delta V_{BE}$ and in the specific embodiment illustrated is equal to 5. A detail of the graph, around 27° C., is shown on the right hand side of FIG. 7, from which it can be clearly seen that X may be split into an integer part (n) and a fractional part (µ').

In summary, then, from one viewpoint an ADC is disclosed above which has, as a first stage, a successive approximation converter, or other compensated, direct comparison converter, followed by a sigma delta modulation converter as a second stage. The sigma delta converter may beneficially be a first order modulator. The resulting ADC combines accuracy with low power consumption per conversion, and thus is particularly suited for use in temperature sensors for applications such as RFID transponders. Such a temperature sensor and an RFID transponder are also disclosed. There is also disclosed a method of analog-to-digital conversion, comprising a first successive approximation register or other compensated, direct comparison conversion stage followed by a sigma delta modulation stage, which, further, may be combined with providing a proportional-to-absolute-temperature (PTAT) signal, for low-power, accurate temperature sensing.

From reading the present disclosure, other variations and modifications will be apparent to the skilled person. Such variations and modifications may involve equivalent and other features which are already known in the art of analog-to-digital converters and temperature sensors, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. An analog-to-digital converter, comprising:
   an analog input,
   a direct comparison converter,
   a sigma delta converter, and
   a digital output,
   the direct comparison converter being configured to determine a first approximation to the digital output, and the sigma delta converter being configured to determine the digital output from the first approximation,
   wherein the direct comparison converter includes digital logic, an integrator and a comparator, and the integrator and the comparator form a part of the sigma delta converter.

2. An analog-to-digital converter as claimed in claim 1, wherein the direct comparison converter is a successive approximation register converter.

3. An analog-to-digital converter as claimed in claim 1 wherein the sigma delta converter comprises a first order sigma delta modulator.

4. An analog-to-digital converter as claimed in claim 1, wherein the digital output has at least 10-bit resolution.

5. An analog-to-digital converter as claimed in claim 1, wherein the digital output has at least 15-bit resolution.

6. An analog-to-digital converter as claimed in claim 1, wherein first approximation has a resolution of at least 4 bits.

7. An analog-to-digital converter as claimed in claim 1, wherein the sigma delta converter is configured to operate without a guard-band capacitor.

8. An analog-to-digital converter, comprising:
   an analog input,
   a direct comparison converter,
   a sigma delta converter, and
   a digital output, the direct comparison converter being configured to determine a first approximation to the digital output, the sigma delta converter being configured to determine the digital output from the first approximation, and the sigma delta converter being configured to use at least one of dynamic error correction and dynamic element matching.

9. A temperature sensor comprising: an analog-to-digital converter, including
   an analog input,
   a direct comparison converter,
   a sigma delta converter,
   a digital output, the direct comparison converter being configured to determine a first approximation to the digital output, and the sigma delta converter being configured to determine the digital output from the first approximation; and
   a bipolar core, which bipolar core comprises two transistors each having a bias-emitter voltage and configured such that in operation the difference between the respective bias-emitter voltages is proportional to absolute temperature.

10. A non-contact transponder comprising a temperature sensor as claimed in claim 9 and a power circuit for providing power to the temperature sensor.

11. A non-contact transponder as claimed in claim 10, wherein the power circuit is configured to, in use, extract power from an electro-magnetic field.

12. A method of converting an analog signal to a digital signal comprising:
   a successive approximation register stage of successive approximating, followed by
   a sigma delta converting stage; wherein the successive approximation stage is carried out by a successive approximation register comprising an integrator and a comparator, the sigma delta stage is carried out by a sigma delta converter, and prior to the sigma delta stage the integrator and the comparator are reconfigured to comprise a part of the sigma delta converter.

13. A method as claimed in claim 12, wherein the sigma delta converting stage is based on a first order modulator.

14. A method of sensing temperature, comprising:
   determining an analog input which is proportional to absolute temperature, and
   converting the analog input to a digital output by the method of claim 12.

* * * * *